(12) United States Patent
Hager et al.

(10) Patent No.: US 10,228,106 B2
(45) Date of Patent: Mar. 12, 2019

(54) LUMINAIRE WITH LIGHT SOURCE AND SPACED-APART LUMINESCENT BODY

(71) Applicant: OSRAM GmbH, Munich (DE)

(72) Inventors: Juergen Hager, Herbrechtingen (DE); Stephan Schwaiger, Ulm (DE); Oliver Hering, Niederstotzingen (DE)

(73) Assignee: OSRAM GmbH, Munich (DE)

( * ) Notice: Subject to any disclaimer, the term of this patent is extended or adjusted under 35 U.S.C. 154(b) by 0 days.

(21) Appl. No.: 15/302,548

(22) PCT Filed: Mar. 23, 2015

(86) PCT No.: PCT/EP2015/056138
§ 371 (c)(1),
(2) Date: Oct. 7, 2016

(87) PCT Pub. No.: WO2015/154983
PCT Pub. Date: Oct. 15, 2015

(65) Prior Publication Data
US 2017/0122516 A1    May 4, 2017

(30) Foreign Application Priority Data

Apr. 11, 2014   (DE) .................. 10 2014 207 024

(51) Int. Cl.
*F21V 9/00* (2018.01)
*F21S 41/14* (2018.01)
(Continued)

(52) U.S. Cl.
CPC ................ *F21S 41/14* (2018.01); *F21K 9/64* (2016.08); *F21S 41/125* (2018.01);
(Continued)

(58) Field of Classification Search
CPC ........ F21S 48/1145; H01S 3/09; H01S 3/091; H01S 5/041
(Continued)

(56) References Cited

U.S. PATENT DOCUMENTS 6,960,872 B2 * 11/2005 Beeson .................. F21V 5/041
                                                                 313/113
9,891,439 B2 *  2/2018 Hu ......................... G02B 27/14
(Continued)

FOREIGN PATENT DOCUMENTS

CN          102089945 A       6/2011
CN          102374468 A       3/2012
(Continued)

OTHER PUBLICATIONS

Maedefessel-Hermann, K., Laser diodes versus LEDs, Nov. 11, 2013, Physics.org, News, Web page.*

(Continued)

*Primary Examiner* — Diane I Lee
*Assistant Examiner* — Keith G. Delahoussaye
(74) *Attorney, Agent, or Firm* — Viering, Jentschura & Partner MBB

(57) ABSTRACT

Various embodiment may relate to a luminaire, including at least one light source, in particular a semiconductor light source, for emitting a primary light beam onto at least one spaced-apart luminescent body, wherein the luminescent body includes at least one hole and a direct light component of the respective primary light beam can be radiated through the at least one hole.

15 Claims, 4 Drawing Sheets

(51) Int. Cl.

| | | |
|---|---|---|
| *F21S 41/32* | (2018.01) | |
| *F21S 41/125* | (2018.01) | |
| *F21S 41/33* | (2018.01) | |
| *F21V 9/30* | (2018.01) | |
| *F21S 41/147* | (2018.01) | |
| *F21S 45/47* | (2018.01) | |
| *F21S 41/37* | (2018.01) | |
| *H01S 5/00* | (2006.01) | |
| *F21V 13/02* | (2006.01) | |
| *F21K 9/64* | (2016.01) | |
| *F21S 41/30* | (2018.01) | |
| *F21S 41/20* | (2018.01) | |
| *F21S 41/40* | (2018.01) | |
| *F21S 41/16* | (2018.01) | |
| *F21W 107/10* | (2018.01) | |
| *F21V 7/04* | (2006.01) | |
| *F21Y 115/30* | (2016.01) | |
| *F21Y 115/10* | (2016.01) | |
| *H01S 5/323* | (2006.01) | |

(52) U.S. Cl.
CPC ............ *F21S 41/147* (2018.01); *F21S 41/16* (2018.01); *F21S 41/20* (2018.01); *F21S 41/30* (2018.01); *F21S 41/321* (2018.01); *F21S 41/322* (2018.01); *F21S 41/338* (2018.01); *F21S 41/37* (2018.01); *F21S 41/40* (2018.01); *F21S 45/47* (2018.01); *F21V 9/30* (2018.02); *F21V 13/02* (2013.01); *H01S 5/005* (2013.01); *H01S 5/0071* (2013.01); *F21V 7/04* (2013.01); *F21W 2107/10* (2018.01); *F21Y 2115/10* (2016.08); *F21Y 2115/30* (2016.08); *H01S 5/32341* (2013.01)

(58) Field of Classification Search
USPC ............................................ 362/510; 372/80
See application file for complete search history.

(56) References Cited

U.S. PATENT DOCUMENTS

| | | |
|---|---|---|
| 2004/0156209 A1 | 8/2004 | Ishida |
| 2008/0074879 A1 | 3/2008 | Kuo et al. |
| 2012/0051078 A1 | 3/2012 | Kinoshita |
| 2012/0236536 A1 | 9/2012 | Harada |
| 2012/0299032 A1 | 11/2012 | Li |
| 2013/0003400 A1 | 1/2013 | Kijima et al. |
| 2013/0003401 A1 | 1/2013 | Sekiguchi et al. |
| 2014/0085923 A1 | 3/2014 | Nakazato |
| 2014/0185272 A1 | 7/2014 | Kishimoto |
| 2015/0055319 A1* | 2/2015 | Zink ............... H01L 33/505 362/84 |

FOREIGN PATENT DOCUMENTS

| | | |
|---|---|---|
| CN | 102853330 A | 1/2013 |
| DE | 102004005931 A1 | 8/2004 |
| DE | 102012005660 A1 | 9/2013 |
| DE | 102012220472 A1 | 5/2014 |
| DE | 102012220481 A1 | 5/2014 |
| EP | 2461090 A2 | 6/2012 |
| EP | 2541129 A2 | 1/2013 |
| JP | 2011243700 A | 12/2011 |
| JP | 5261549 B2 | 8/2013 |
| JP | 2014060164 A | 4/2014 |
| WO | 2010004477 A2 | 1/2010 |
| WO | 2013094221 A1 | 6/2013 |
| WO | 2013148276 A1 | 10/2013 |

OTHER PUBLICATIONS

German Search Report based on application No. 10 2014 207 024.4 (8 pages) dated Mar. 6, 2015.
International Search Report based on PCT/EP2015/056138 (5 pages + 3 pages English translation) dated May 21, 2015.
Chinese Office Action based on application No. 201580018923.2 (7 pages) dated Feb. 14, 2018.

* cited by examiner

LUMINAIRE WITH LIGHT SOURCE AND SPACED-APART LUMINESCENT BODY

RELATED APPLICATIONS

The present application is a national stage entry according to 35 U.S.C. § 371 of PCT application No.: PCT/EP2015/056138 filed on Mar. 23, 2015, which claims priorities from German application No.: 10 2014 207 024.4 filed on Apr. 11, 2014, and is incorporated herein by reference in its entirety.

TECHNICAL FIELD

Various embodiments relate to a luminaire, including at least one light source, in particular a semiconductor light source, for emitting a primary light beam onto at least one spaced-apart luminescent body. Various embodiments also relate to a vehicle headlight, which includes at least one such luminaire. Various embodiments furthermore relate to a vehicle which includes at least one such vehicle headlight. The type of the vehicle is fundamentally not restricted and may include air-based, water-based, and/or land-based vehicles, in particular motor vehicles, in particular motorcycles, passenger automobiles, or trucks. Various embodiments are applicable in particular to motor vehicle headlights. Various embodiments are applicable in particular to light sources in the form of lasers, in particular semiconductor lasers. Various embodiments are applicable in particular to LARP headlights.

BACKGROUND

So-called LARP ("laser activated remote phosphor") headlights are known, in which primary light emitted by at least one laser light source is incident on a conversion element or luminescent body and is at least partially converted thereby into secondary light of a longer wavelength. The secondary light or mixed light (composed of the non-converted primary light and the converted secondary light) emitted by the luminescent body is used as useful light to form a light emission pattern of the LARP headlight. At least one optical element is connected downstream of the luminescent body for beam forming of the light emission pattern, for example, at least one lens, at least one reflector, and/or at least one screen.

If damage occurs to the luminescent body or even a removal of the luminescent body occurs, for example, due to a thermal overload and/or frequent impacts, the primary light beam will be incident at least partially directly on the at least one downstream optical element and will exit as a concentrated light beam from the LARP headlight. This concentrated light beam may have such a high radiation intensity that strong dazzling or damage, particularly to the eyes and the skin, could occur in a few cases upon observation of the headlight by a human.

SUMMARY

Various embodiments provide a luminaire having at least one light source, in particular a semiconductor light source, having a downstream luminescent body, which enables particularly safe operation even in the event of damage or loss of the luminescent body.

Various embodiments provide a luminaire, including at least one light source for emitting a primary light beam onto at least one spaced-apart luminescent body, wherein the luminescent body includes at least one through hole and a direct light component of the respective primary light beam can be radiated through the at least one hole.

This luminaire has the advantage that it is particularly thermally stable, can generate a multi-form light emission pattern, and offers a high level of safety for the case of unintentional damage to the phosphor or even a loss of the luminescent body.

Because a part of the primary light beam (namely the "direct light component") is conducted through the luminescent body practically without interaction, heating of the luminescent body by wavelength conversion is reduced. This keeps a conversion efficiency high and reduces aging of the luminescent body. The reduced aging in turn reduces the probability that the luminescent body or parts thereof will detach.

The direct light component may additionally be shaped differently than the conversion light emitted by the luminescent body, whereby the possibility results of generating particularly multiform light emission patterns.

For example, the conversion light and the direct light component can fulfill different functions. In one variant, a conventional light emission pattern may be generated by means of the conversion light, for example, a low beam or high beam of a motor vehicle, while the direct light component partially brightens special regions thereof. The direct light component may also be transmitted or blocked as a function of the selected light emission pattern, for example, by means of a switchable screen and/or a "shutter".

The safety aspect can be fulfilled, for example, in that the direct light component of the luminaire can be guided substantially separately from the conversion light and can therefore also be influenced to reduce its radiation intensity. If the luminescent body should be entirely or partially damaged or removed (for example, due to mechanical load, aging, etc.), an undefined or undesired light path for the primary light beam, which then propagates unobstructed, does not result. Rather, this primary light beam then extends on the light path of the direct light component and is also reduced in intensity without further measures in this case. This light path may be adapted easily to the case of damage or removal of the luminescent body, so that there is then no risk to a user, for example, with respect to its area.

The light source may in particular be a semiconductor light source, for example, a light-emitting diode or a laser diode. However, the light source is not restricted thereto, but may, for example, also be another type of laser or another type of light source, which preferably generates coherent or strongly bundled light.

A primary optical unit, which is arranged between the light source itself and the luminescent body, may be associated with the at least one light source. The optical unit may be used, for example, for preforming the primary light beam emitted from the at least one light source, for example, homogenizing it in its intensity, focusing it, widening it, making it parallel, etc. The primary optical unit may also be used to change a cross-sectional form of the primary light beam, for example, from an originally elliptical shape into a circular shape. This may be performed in particular by primary optical units in the form of collimators having glass fibers, freeform collimation lenses, systems made of multiple (non-rotationally symmetrical) aspherical converging lenses, etc. However, the originally emitted primary light beam may in principle also already have a shape which is circular in cross section. An asymmetrical, for example, elliptical cross-sectional form of the primary light beam incident on the luminescent body may be implementable particularly simply, for example, by single lenses having only one semiconductor light source.

The luminescent body has one or more conversion materials or phosphors, which at least partially convert the incident primary light into respective secondary light of a longer wavelength (down conversion) or also into secondary light of shorter wavelengths (up conversion). The conversion light emitted by the luminescent body may thus be practically solely secondary light or a mixed light having components of primary light and secondary light.

For example, the mixed light may be a blue-yellow or white mixture in total, composed of blue primary light and yellow secondary light generated by a blue-yellow converting phosphor. A degree of conversion may be set, for example, by means of a concentration of the phosphor and/or a thickness of the luminescent body. The degree of conversion is preferably constant over its surface, but the luminescent body is not restricted thereto.

The luminescent body is preferably a laminated or layered body having a thickness which is substantially (for example, an order of magnitude) less than its planar extension. Such a layered luminescent body may have been, for example, printed or sprayed onto a light-transmissive substrate (for example, a sapphire body) or may have been prefinished as a plate and then glued onto a substrate. The luminescent body may be provided in the form of a ceramic phosphor in particular. An external contour of the layered luminescent body may be shaped, for example, round (for example, circular or elliptical), polygonal (for example, square or rectangular), and/or freeform.

The fact that the luminescent body includes at least one hole may include that at least one through opening is provided in the luminescent body. Alternatively, at least one region having a reduced quantity of phosphor may exist therein, for example, achieved by a lower layer thickness and/or phosphor concentration. The incident primary light beam may be partially converted into secondary light in the region having a reduced quantity of phosphor, however, to such a small extent that the direct light component exits as a (in particular non-deflected) partial beam of the incident primary light beam.

The luminescent body may have been produced in one piece or multiple parts. With the one piece production, the at least one hole may already be introduced during the production of the basic form (for example, by not covering a corresponding area using phosphor) or introduced subsequently (for example, by material removal). A luminescent body produced in multiple parts has been assembled from multiple individual parts which were previously produced separately. A hole may also have been introduced subsequently here by material removal. Alternatively, at least two of the individual parts may have a gap between them. For example, a central hole can be achieved in a circular luminescent body by assembling pie-piece-like individual parts, which are missing the tip.

The luminescent body may be, for example, an independent load-bearing body, for example, a ceramic luminescent plate, or may be, for example, a coating located on a light-transmissive carrier, for example, a sapphire plate.

In one embodiment, the at least one hole is arranged centrally or in a central region of the luminescent body, which facilitates cooling of the luminescent body. The fact is utilized in this case that the luminescent body is fastened in particular on its edge and is thus thermally connected to dissipate the waste heat (Stokes heat) generated by the wavelength conversion.

Due to the at least one hole in the center, a construction which is particularly thermally favorable is achieved, because now the part of the luminescent body which is thermally loaded most strongly (namely the center) no longer generates heat. The regions of the luminescent body which are located farther away from the center are fundamentally better connected at the thermal interface at the edge of the luminescent body and typically also experience a lesser power introduction upon use of a laser as the light source, because a power density of a laser beam (typically having a Gaussian distribution in cross section) is significantly higher in the center than at the edge.

Overall, the luminescent body thus generates in particular wide-angle conversion light and enables the passage of one or more narrower direct light components or direct light beams.

The hole or the holes can fundamentally assume an arbitrary form and/or, in the case of multiple holes, can also be arranged arbitrarily in relation to one another. The hole may be formed, for example, as a circular hole, an elliptical hole, a ring, or as an oblong slot. The holes can be arranged, for example, in a star shape, circularly circumferential, elliptically circumferential, polygonally circumferential, in a lattice, or randomly distributed on the luminescent body. The distribution of the surface size of the individual holes can be embodied such that the total of all individual areas corresponds to a predefined value. The phosphor can be applied as a phosphor layer, for example, to a reflective carrier or a light-transmissive carrier, for example, a sapphire plate.

A single hole may be advantageous, for example, if only a single primary light beam is incident on the luminescent body, in particular if it has a significantly uneven intensity distribution in cross section. Multiple holes may be advantageous, for example, if multiple primary light beams are incident on the luminescent body or if one primary light beam is broad and has a homogenized intensity distribution. A ratio between the direct light component and the component incident on the luminescent body may thus be set precisely by the number of the holes in the case of a broad and homogenized primary light beam.

The luminescent body and in particular the at least one hole may be irradiated perpendicularly or diagonally by the primary light. In the case of diagonal incident radiation of the primary light, the at least one hole may be formed so that it has the desired form upon projection on a plane perpendicular to the incident primary light beam. In other words, the at least one hole can be formed so that it compensates for a distortion due to the inclination in relation to the primary light beam.

In one embodiment, the direct light component includes a part of highest power density of the primary light beam, for example, defined as a region at the outer boundary of which the intensity has dropped to 50% or to 1/e (where e is the Euler number) of a center intensity. A beam component of particularly high radiation intensity can thus be made harmless. It is also an embodiment that the direct light component corresponds in cross section to an inner region of the primary light beam. In particular beam components of critically high radiation intensity, which originate from a semiconductor light source such as a laser or a light-emitting diode, can be made harmless particularly effectively by this embodiment/these embodiments.

In a further embodiment, the direct light component emitted from the luminaire corresponds at most to a laser class 2, in particular at most a laser class 1, for example, according to standard EN 60825-1 or DIN VDE 0837. By means of a setting to laser class 2, eye safety may be established in all practically occurring cases, with setting to laser class 1, also in the event of more detailed inspection of the luminaire at short distances.

In still a further embodiment, the direct light component has a half aperture angle between 0.5° and 15° with symmetrical cross-sectional form. The beam component of particularly high radiation intensity in particular of conventional lasers as well may thus be transmitted as the direct light component through the at least one hole.

It is also an embodiment that the direct light component has a least half aperture angle between 0.5° and 15° and a greatest half aperture angle of at most between 1.5° and 30° with asymmetrical cross-sectional form of the primary light beam. In particular, the greatest half aperture angle is advantageously greater by up to a factor of 3 than the least half aperture angle. The beam component of particularly high radiation intensity, in particular also of conventional lasers having elliptical cross-sectional form of the primary light beam, may thus radiate as the direct light component through the at least one hole.

It is also an embodiment that the conversion light emitted by the luminescent body and the direct light component are at least essentially optically guided separately. This may mean in particular that beam forming of the direct light component or the conversion light does not substantially influence the respective other light component. Thus, for example, an absorption of the direct light component may have no or only a minor influence on the light emission pattern generated by the conversion light. A slight admixture of conversion light to the direct light component may be practically negligible. The direct light component can therefore be considered independently and at least substantially independently of the conversion light.

It is in particular an embodiment therefor that the direct light component is only incident on at least one first optical surface and the conversion light is incident on at least one second optical surface. The direct light component can thus be independently influenced in a simple manner, without the conversion light emitted from the first optical surface as useful light being substantially influenced thereby. In one variant, the second optical surface can be designed like a conventional optical surface of, for example, a headlight, for example, as a shell reflector. The first optical surface is in particular embodied so that it reduces the radiation intensity of the direct light component.

It is a refinement that the first optical surface has a larger surface than a partial surface thereof irradiated by the direct light component. In this way, in the event of damage to or a loss of the luminescent body, at least a part of the primary light or primary light component which is then no longer converted is also incident on the first optical surface and is thus reduced particularly strongly in its radiation intensity. Alternatively, practically the entire first optical surface may be able to be irradiated by the direct light component. This may be advantageous if, in the event of damage to or a loss of the luminescent body, the primary light, which is then no longer converted, is already so weak that it also already remains under a predetermined threshold value of the radiation intensity upon an irradiation of the second optical surface.

The first optical surface may in particular be shaped and/or aligned differently to the second optical surface. It may thus in particular not only be a limited subregion of an otherwise uniformly shaped optical surface. The differentiable shape may include, for example, a different basic shape (for example, spherical instead of elliptical, elliptical instead of paraboloid, etc.) and/or a different angle of curvature. The differentiable shape may additionally or alternatively include a different surface composition. The differentiable alignment may include, for example, angling of first and second optical surfaces. The differentiability may also be implemented by a spatial separation or spacing apart of the first and second optical surfaces.

The first optical surface may be designed as light-absorbing, for example, which enables a particularly high level of eye safety. It can alternatively be designed as mirror reflective and beam widening, whereby the direct light component may still be used in a targeted manner to form the light emission pattern, for example, for brightening a corresponding region of the light emission pattern, for example, using blue primary light. It can also be designed as diffusely reflective, which generates less heating than absorption and additionally also enables scattered light illumination of the surroundings, for example, for improved lateral visibility with low beam intensity.

In still another refinement, the first optical surface may be partially light absorbing and partially reflective. It may also be partially diffusely reflective and partially specularly reflective.

The first optical surface may be a single, full-surface light-absorbing and/or reflective surface.

The first optical surface may alternatively be a coherent light-absorbing and/or reflective surface, which has one or more inner openings. It may then be designed as ring-shaped or latticed, for example.

The first optical surface may also have multiple non-coherent light absorbing and/or reflective subregions, however, for example, in the form of a strip pattern, a matrix pattern, a ring-shaped pattern, an irregular dot pattern, etc.

The at least one first optical surface is, as a result of the typically much narrower aperture angle of the beam of the direct light component in comparison to the conversion light, generally very much smaller than the second optical surface. A function of the second optical surface is therefore influenced only slightly to practically not at all by the first optical surface.

It is furthermore an embodiment that the at least one first optical surface is arranged in front of the at least one second optical surface with respect to the luminescent body, i.e., in particular has a smaller distance to the luminescent body than the second optical surface. The size of the first optical surface can thus be kept particularly small, in particular in the case of a comparatively strongly divergent direct light component.

It is additionally an embodiment that the at least one first optical surface is arranged behind an opening in the at least one second optical surface. This enables a particularly simple spatial separation of the direct light component from the conversion light. A light emission pattern generated by means of the conversion light may especially thus be influenced particularly little by the direct light component.

It is also an embodiment that the at least one first optical surface and the at least one second optical surface are associated with a common component. This makes production and installation of the luminaire easier.

It is an alternative embodiment that the at least one first optical surface and the at least one second optical surface are associated with different components. A particularly variable forming and arrangement of the optical surfaces is thus enabled.

It is additionally an embodiment that the conversion light emitted from the luminescent body and the direct light component can be radiated into a refractive optical element.

It is also an embodiment that the luminaire is a vehicle headlight or a part thereof.

The object is also achieved by a vehicle headlight which includes at least one such luminaire. The vehicle headlight may be a headlight of a motor vehicle, for example. It may generate, for example, a low beam, a high beam, a fog light, a cornering light, and/or a daytime running light.

The object is also achieved by a vehicle which includes at least one such vehicle headlight. The type of the vehicle is not restricted in principle and may include air-based, water-based, and/or land-based vehicles, in particular motor vehicles, in particular passenger automobiles or trucks.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

Figure 1:
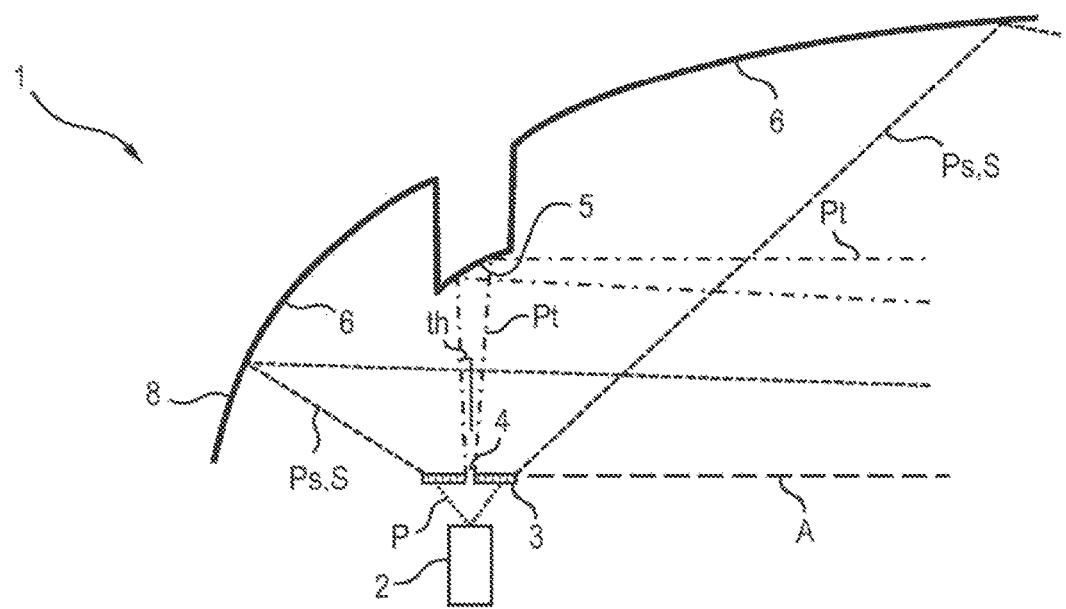
FIG. 1 shows a sectional illustration in a side view of a luminaire according to a first embodiment.

FIG. 1 shows a luminaire in the form of a vehicle headlight 1 having a light source in the form of a laser 2, which emits a blue primary light beam P perpendicularly onto a thin, disk-shaped luminescent body 3, which is spaced apart therefrom, for example, a phosphor layer or a ceramic phosphor plate. The laser 2 may be implemented, for example, as a laser diode. Phosphor for at least partial wavelength conversion of the blue primary light beam P into yellow secondary light S is located in the luminescent body 3. Conversion light Ps, S in the form of white or blue-yellow mixed light can thus be emitted from the luminescent body 3 as an overlay of the secondary light S with primary light Ps, which passes through the luminescent body 3 and is possibly scattered. The conversion light Ps, S is comparatively broadly scattered.

The laser 2 and the luminescent body 3 are constructed here in a transmitted light arrangement, in which the conversion light Ps, S emitted from the side of the luminescent body 3 facing away from the incident primary light beam P is used as the useful light. However, a reflective structure is also possible.

The luminescent body 3 has a central hole 4, the cross section of which is smaller than a cross section of the primary light beam P. The primary light beam P is radiated onto the hole 4 so that a component (which is referred to hereafter as the "direct light component" Pt) of the primary light P radiates through the hole 4. The primary light beam P especially radiates onto the hole 4 so that the direct light component Pt corresponds in cross section to the region of the primary light beam P having the highest power density or radiation intensity. Instead of one hole 4, multiple holes can also be provided. A size and/or a shape of the at least one hole 4 can be varied in a broad range.

The laser safety and/or the laser class may be set by a variation of, for example, the hole size, the number of holes, and further properties of the luminescent body 3, such as a dopant of the phosphor, a scattering center density, and/or a thickness.

A proportional light beam or core beam is thus maintained as the direct light component Pt, which has the same beam direction as the primary light beam P, on the side of the luminescent body 3 facing away from the incident primary light beam P. A cross-sectional form of the direct light component Pt may be, for example, circular or oval (in particular elliptical).

A half aperture angle th of the direct light component Pt may preferably be between 0.5° and 15° with circular cross-sectional form of the direct light component Pt. With an oval cross-sectional form of the direct light component Pt, a least half aperture angle th (at the small half axis) may in particular be between 0.5° and 15° and a greatest half aperture angle th (at the greatest half axis) may be between 1.5° and 30°.

The remaining component of the primary light beam P, which surrounds the direct light component Pt, is incident on the luminescent body 3 and is emitted in partially converted form as the mixed white conversion light Ps, S, alternatively, for example, as fully converted yellow secondary light S. The conversion light Ps, S has a substantially broader angle distribution than that of the direct light component Pt.

The direct light component Pt of the original primary light P, which passes the phosphor 3 unobstructed, is advantageously less for an effective light yield than that of the proportion of the primary light P which is incident on the luminescent body 3, i.e., less than 50%, in particular less than 40%, in particular less than 30%, in particular less than 20%, in particular less than 10%.

The direct light component Pt is only incident on a first optical surface in the form of a first reflection surface 5. The first reflection surface 5 is designed as shell-shaped, for example, ellipsoid, hyperboloid, paraboloid, or as a multi-faceted freeform surface and is specularly (mirror) reflective. In particular, the direct light component Pt does not illuminate the entire first reflection surface 5 in the case of intact luminescent body 3.

The first reflection surface 5 is enclosed by a much larger second optical surface in the form of a second reflection surface 6, which is also designed as shell-shaped, for example, ellipsoid, hyperboloid, paraboloid, or as a multi-faceted freeform surface and specular (mirrored). The conversion light Ps, S emitted from the luminescent body 3 is primarily incident (preferably at least 90%, in particular 95%, in particular 99%) on the second reflection surface 6, but a small component thereof may also radiate onto the first reflection surface 5. However, the direct light component Pt on the first reflection surface 5 is dominant in relation to the conversion light component and/or the component of the conversion light Ps, S is negligible. The conversion light or the mixed light Ps, S and the direct light component Pt are separately guided optically as a result of the only slight mixing thereof.

By means of the conversion light Ps, S, in particular a conventional light emission pattern of the vehicle headlight 1 may be generated, for example, a low beam, high beam, fog light, etc. The direct light component Pt may additionally illuminate a locally delimited region of the light emission pattern and thus brighten it further, for example, or may cause a desired light emission pattern or a desired color setting.

The first reflection surface 5 is especially embodied so that an angle distribution of the direct light component Pt is provided in the optical path behind the first reflection surface 5, which makes the vehicle headlight 1 harmless to an observer. This can be achieved, for example, by a sufficiently strong beam widening, i.e., in that the direct light component Pt is reflected in a correspondingly large spatial angle. A reflection of the direct light component Pt in such spatial angles which lie at least in the far field (for example, from approximately 5 m to 10 m in front of the vehicle headlight 1) within the light emission pattern generated by the conversion light preferably suggests itself. The direct light component Pt can thus provide a contribution to the light emission pattern. A brightness may thus be increased therein. The blue color of the direct light component Pt may also improve a visibility of the irradiated objects. It is advantageous if the spatial angle in which the direct light component Pt is reflected assumes a large horizontal width, which may easily be configured, for example, in the case of light emission patterns for generating low beam, fog light, or high beam.

In case of damage, a larger component of the primary light beam P, possibly even the entire primary light beam P, is radiated onto the reflector 8. In one variant, the first reflection surface 5 is sufficiently large that the entire primary light beam P is then incident thereon and is reducible in its radiation intensity to a desired amount. In another variant, an outer part of the primary light beam P in the cross section is incident on the second reflection surface 6. This may not represent a hazard, however, if the primary light component incident on the second reflection surface 6 is sufficiently weak that it is already below a critical hazard threshold value even without the special reduction of the beam intensity by the first reflection surface 5.

It is particularly preferable that in normal operation, the direct light component Pt and, in case of damage, the primary light beam P are classified according to laser class 2, preferably even according to laser class 1. Since the size of the hole 4 and possibly the number of the holes 4 directly contribute to the light power of the direct light component Pt, these parameters may also be adapted to achieve a specific laser class for the direct light component Pt.

The first reflection surface 5 is preferably arranged in front of the second reflection surface 6 with respect to the light path, and therefore closer to the luminescent body 3. The two reflection surfaces 5 and 6 are thus spaced apart from one another and therefore separate.

At least the first reflection surface 5 and/or the second reflection surface 6 may be designed as at least partially diffusely reflective as needed. For example, local partial matting of the first reflection surface 5 and/or the second reflection surface 6 is possible. In addition, instead of the first reflection surface 5, a light-absorbing screen may also be used.

The first reflection surface 5 and/or the second reflection surface 6 are embodied here as surfaces of a shared component, namely a reflector 8.

The luminescent body 3 is aligned in parallel to an optical axis A of the second reflection surface 6. It is also possible to arrange the luminescent body 3 at an angle to the optical axis A, for example, to increase a collection efficiency of the reflector 8 or to take structural space relationships into consideration.

The hole 4 is preferably located at a focal point of the first reflection surface 5, while the luminescent body 3, which emits the conversion light Ps, S, is preferably located in a region of a focal point of the second reflection surface 6.

Figure 2:
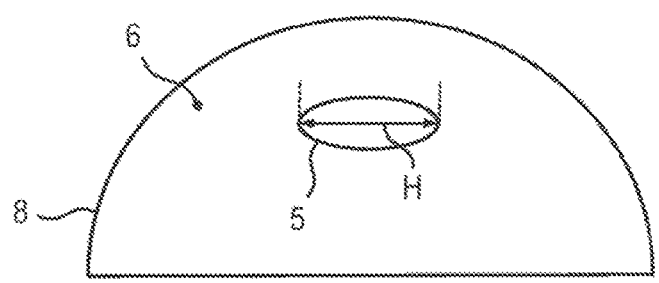
FIG. 2 shows a reflector of the luminaire according to the first embodiment in a view from the front.

FIG. 2 shows the reflector 8 of the vehicle headlight 1 from the front (from the right in FIG. 1). The first reflection surface 5 is now shown as formed elliptically, to be able to deflect a direct light component Pt, which is also formed elliptically in cross section, completely but without loss of surface, into the far field. The elliptical form suggests itself in particular in the case of a typically elliptical primary light beam P of a single laser 2.

In principle, the laser 2 and the first reflection surface 5 can also be aligned differently, however, for example, pivoted by an arbitrary angle, for example, by 90° about a main emission direction.

A large half axis H of the first reflection surface 5 may be aligned in particular so that in the case of a direct imaging of the direct light component Pt, it contributes in the light emission pattern to a broad range, for example, with respect to a horizontal extension of a low beam or high beam light distribution.

Figure 3:
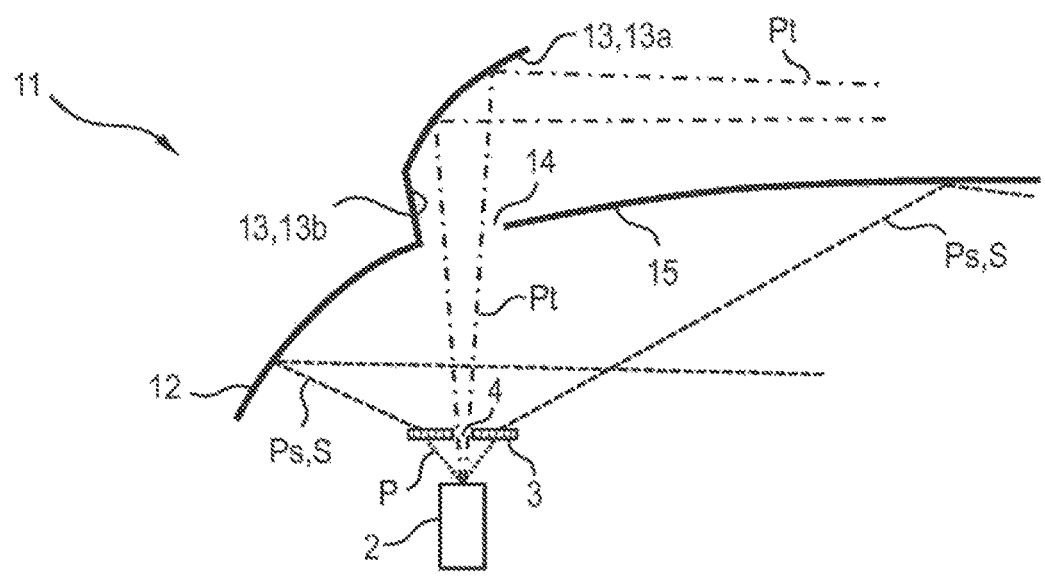
FIG. 3 shows a sectional illustration in a side view of a luminaire according to a second embodiment.
Figure 4:
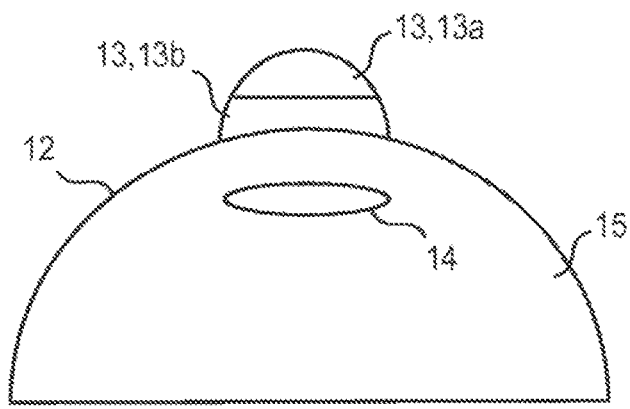
FIG. 4 shows a reflector of the luminaire according to the second embodiment in a view from the front.

FIG. 3 shows a sectional illustration in a side view of a luminaire 11 according to a second embodiment having a reflector 12. FIG. 4 shows the reflector 12 in a view from the front.

The luminaire 11 has an identical basic structure as the luminaire 1, wherein, however, a first reflection surface 13 is arranged behind an opening 14 of a second reflection surface 15. The opening 14 may be formed circular or elliptical, for example.

The first reflection surface 13 may be formed similarly to the first reflection surface 5 of the luminaire 1, for example, shell-shaped, for example, ellipsoid, hyperboloid, or paraboloid. The second reflection surface 15 may be formed similarly to the second reflection surface 6 of the luminaire 1, for example, shell-shaped, for example, ellipsoid, hyperboloid, or paraboloid.

This embodiment enables, in a particularly simple manner, a spatial separation of the direct light component Pt emitted by the first reflection surface 13 and the conversion light Ps, S emitted by the second reflection surface 15, because the radiation Pt or Ps, S reflected therefrom, respectively, is at least sectionally separated by the reflector 12. This may be used, for example, to further form and optionally even entirely block the direct light component Pt without influencing the conversion light Ps, S, for example, by means of an optical unit (not shown) associated only with the direct light component Pt. This optical unit may include, for example, at least one screen, at least one lens, at least one reflector, etc.

The first reflection surface 13 may have two subregions 13a and 13b, while a first subregion 13a is irradiated by the direct light component Pt and a second subregion 13b is not irradiated by the direct light component Pt. The second subregion 13b is rather located outside the direct light component Pt in normal operation and is located in parallel to a radiation direction at the edge of the primary light beam P in case of damage. The second subregion 13b, which may also be designed as nonreflective, is instead predominantly used as a carrier or fastening of the first subregion 13a. Due to the external spacing apart of the first reflection surface 13a from the second reflection surface 15, it is advantageously made possible that the direct light component Pt reflected by the first subregion 13a is not shaded by the reflector 12. Variable beam guiding is also thus achieved.

In general, however, the second subregion 13b may also be omitted, so that the externally arranged first reflection surface 13 is then completely irradiated by the direct light component Pt and/or the first subregion 13a is placed directly on the opening 14.

Figure 5:
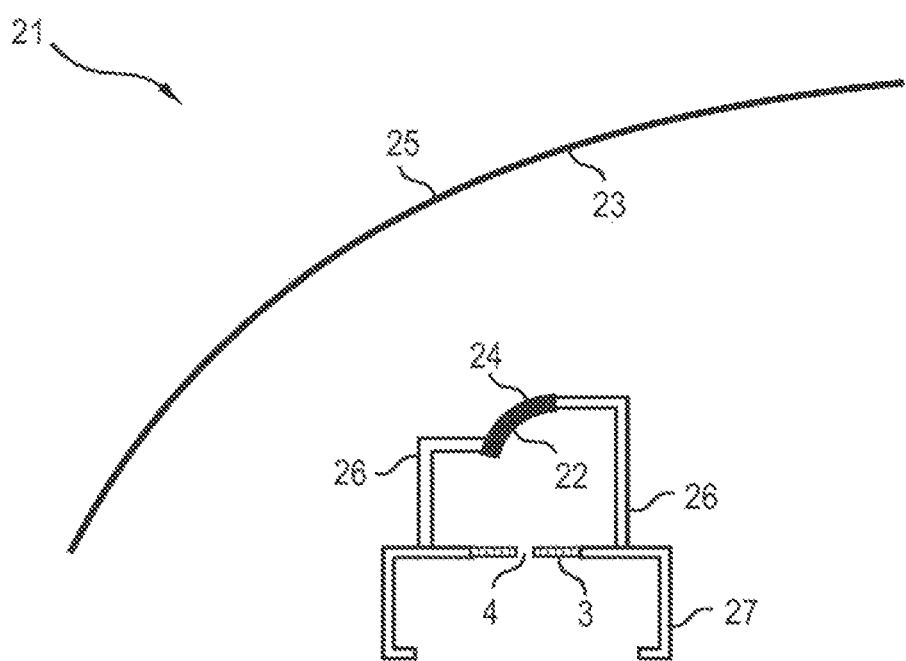
FIG. 5 shows a sectional illustration in a side view of a luminaire according to a third embodiment.

FIG. 5 shows a sectional illustration in a side view of a luminaire 21 according to a third embodiment without the laser 2.

While in the luminaires 1 and 11, the first reflection surface 5 or 13 and the second reflection surface 6 or 15, respectively, are associated with a common reflector 8 or 12, respectively, for example have been produced in one piece, in the luminaire 21, the first reflection surface 22 and the second reflection surface 23 are associated with different components. A first reflector 24, which provides the first reflection surface 22, is arranged between the luminescent body and a second reflector 25, which only provides the second reflection surface 23. The first reflector 24 is held by means of a mount or a framework 26, which preferably consists of light-transmissive (transparent or translucent) material, in particular plastic, to keep a light loss low. The framework 26 may be connected to a mount 27 for the luminescent body 3. The mount 27 preferably consists, for the edge-side heat dissipation from the luminescent body 3, of metal and may be, for example, connected to a heat sink (not shown).

The framework 26 and the mount 27 may be fixedly connected to one another, for example, clamped, latched, and/or glued to one another. The framework 26 may additionally or alternatively be connected to a mount of the laser 2 or the primary optical unit (not shown) thereof.

Figure 6:
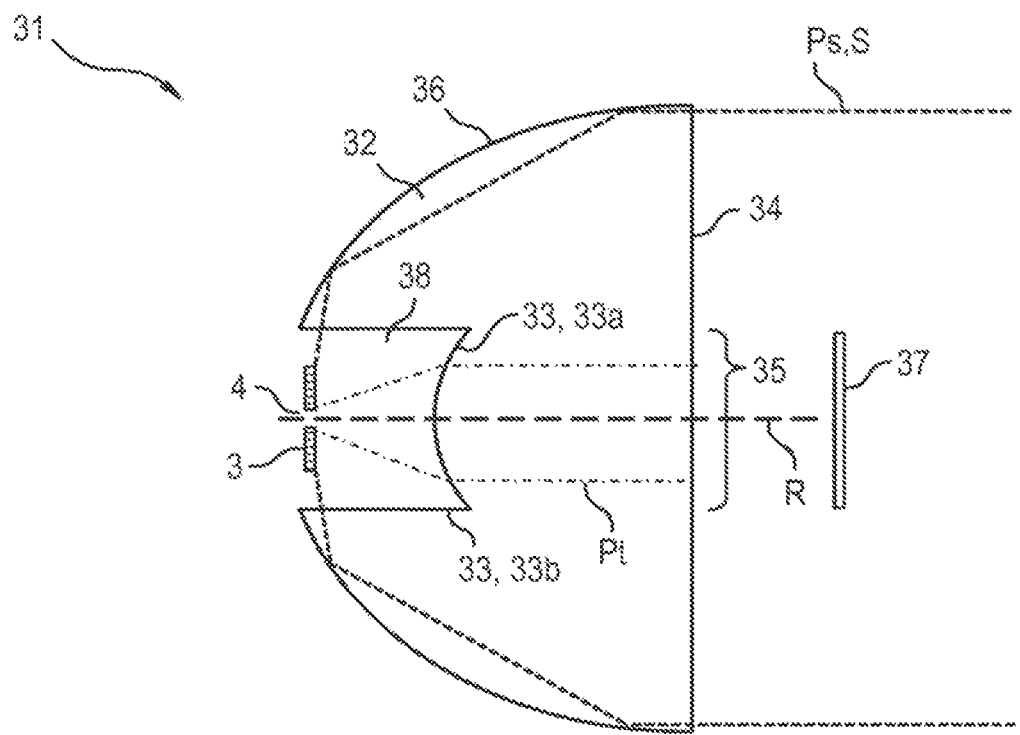
FIG. 6 shows a sectional illustration in a side view of a luminaire according to a fourth embodiment.

FIG. 6 shows a sectional illustration in a side view of a luminaire 31 according to a fourth embodiment without the laser 2. The conversion light Ps, S emitted by the luminescent body 3 and the direct light component Pt radiated through the hole 4 are radiated into a refractive optical element 32 here. The refractive optical element 32 may, for example, make parallel, focus, and/or align the light Pt, Ps, S, which is incident on a rear light entry surface 33, for example, for passage at a, for example, front light exit surface 34. The refractive optical element 32 may be designed, for example, as a spherical, paraboloid, or hyperboloid rotational body having an axis of rotation R.

The light entry surface 33 may correspond, for example, to a surface of a recess 38 arranged centrally about the axis of rotation R. The light entry surface 33 may be divided into two different subregions 33a and 33b, which have different basic shapes. Only a first convex subregion 33a, which is formed centrally about the axis of rotation R, is irradiated by the direct light component Pt. The direct light component Pt radiated therein passes through the refractive optical element 32 and maximally exits again at the light exit surface 34 in a central region 35 centered about the axis of rotation R.

If the luminescent body 3 is not damaged, only a part of the first subregion 33a is irradiated, so that the direct light component Pt then also does not exit at the entire central region 35. In contrast, if the luminescent body 3 is no longer present, for example, the entire first subregion 33a is irradiated by the direct light component Pt. The first subregion 33a may cause a lens-type beam forming.

A second subregion 33b, which is, for example, hollow cylindrical, for example, located centrally about the axis of rotation R, adjoins an edge of the first subregion 33a. The rotational symmetry and/or the central arrangement are not required, however. It may thus be preferable in the case of non-round or non-square light sources that the shape is not rotationally symmetrical. The second subregion 33b may also correspond to a free-form surface, for example.

The conversion light Ps, S is irradiated both onto the first subregion 33a and also, in particular in a larger component, onto the second subregion 33b. The conversion light Ps, S may be reflected by internal total reflection on a lateral surface 36, for example. In one variant, in case of damage, an edge region of the direct light component Pt, which in particular already has a harmless radiation intensity, may be incident on the second subregion 33b.

In one variant, an optical element 37 may be connected downstream of the central region 35. It may be provided as a separately produced element, which rests on the light exit surface 34 or, as shown, is arranged spaced apart therefrom. The optical element 37 may alternatively be provided as a coating applied to the central region 35. The optical element 37 may be designed as a screen, which absorbs the light exiting from the central region 35. The optical element 37 may alternatively be provided as a diffuser (diffuser plate, diffuser layer, or the like) to fan out the light exiting from the central region 35 in a large area and thus reduce its intensity. It may also be a lens, for example, which widens the light exiting from the central region 35 sufficiently, in particular in the horizontal direction, that it is harmless.

The light exit surface 34 shown is illustrated as a planar surface, but is not restricted thereto. Thus, for example, it may also have an optically active structure, for example, a Fresnel pattern or a field of refractive (micro-)lens regions.

Instead of an arrangement which is completely rotationally symmetrical about the axis of rotation R, the refractive optical element 32 may also have a form which is elliptical in cross section in relation to the axis of rotation R. This may be advantageous in particular if the primary light beam P has an elliptical shape in cross section.

A light beam emitted from the laser may thus have a converging and/or a convergent form in the plane of the luminescent body or in the hole. It may diverge again thereafter, but still before an incidence on a reflection surface.

Different optical elements can also be used for beam forming of the light, for example a shell reflector for reflection only of the conversion light and a refractive optical element for beam forming of the direct light component.

Multiple semiconductor light sources, in particular lasers, of identical or different frequencies, can also be used for irradiating the luminescent body. The primary light beams can be guided together via suitable optical arrangements, for example, TIR optical units or mirror elements, and oriented onto the conversion element. One or more semiconductor light sources can also be aligned and/or focused so that they preferably illuminate the center region of the conversion element; other semiconductor light sources can then illuminate edge regions of the luminescent body. The semiconductor light sources which are aligned and/or focused on the center region of the luminescent body may emit a different radiation frequency than the semiconductor light sources which irradiate the outer regions of the luminescent body. The semiconductor light sources can be operated in continuous operation and/or cyclically.

In general, in the embodiments shown, at least one further optical element can be connected downstream, for example, for imaging of the light emission pattern in an environment, in particular in a far field. This at least one further optical element may include, for example, at least one refractive element such as a lens, at least one screen, at least one reflector, etc. The luminaires shown in the embodiments are usable in particular with vehicles, in particular as vehicle headlights or with vehicle headlights.

In general, "a", "an", etc. can be understood as a single one or a plurality, in particular in the meaning of at least one or "one or more", etc., as long as this is not explicitly precluded, for example, by the expression "precisely one", etc.

A numeric specification can also include precisely the specified number and also a routine tolerance range, as long as this is not explicitly precluded.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A luminaire comprising:
    at least one spaced-apart luminescent body comprising at least one hole;
    at least one first reflector surface arranged over the at least one hole;
    at least one light source for emitting a primary light beam onto the at least one spaced-apart luminescent body, wherein the primary light beam comprises a direct light component that is radiated through the at least one hole; wherein conversion light emitted by the luminescent body and the direct light component are reflectively guided separately.

2. The luminaire as claimed in claim 1, wherein the direct light component comprises a part of highest power density of the primary light beam.

3. The luminaire as claimed in claim 1, wherein the direct light component emitted from the luminaire corresponds at most to a laser class 2.

4. The luminaire as claimed in claim 1, wherein the direct light component has a half aperture angle between 0.5° and 15° with symmetrical cross-sectional form.

5. The luminaire as claimed in claim 1, wherein the direct light component comprises two half apertures; wherein a first half aperture angle ranges from 0.5° to 15° and a second half aperture angle ranges from 1.5° to 30° with asymmetrical cross-sectional form.

6. The luminaire as claimed in claim 1, wherein conversion light emitted from the luminescent body and the direct light component are radiated into a refractive optical element.

7. The luminaire as claimed in claim 1, wherein the luminaire is a vehicle headlight or a part thereof.

8. The luminaire as claimed in claim 1, wherein the direct light component is only incident on the at least one first reflector surface and the conversion light is incident at least on a second reflector surface wherein the at least one first reflector surface is embodied so that it reduces a radiation intensity of the direct light component.

9. The luminaire as claimed in claim 8, wherein the at least one first reflector surface is arranged over the at least one second reflector surface with respect to the luminescent body.

10. The luminaire as claimed in claim 8, wherein the at least one first reflector surface is arranged under an opening in the at least one second reflector surface with respect to the luminescent body.

11. The luminaire as claimed in claim 8, wherein a first reflector comprises the at least one first reflector surface and the at least one second reflector surface.

12. A vehicle headlight comprising;
    at least one luminaire comprising;
        at least one spaced-apart luminescent body comprising at least one hole;
        at least one first reflector surface arranged over the at least one hole;
        at least one light source for emitting a primary light beam onto the at least one spaced-apart luminescent body, wherein the primary light beam comprises a direct light component that is radiated through the at least one hole; wherein conversion light emitted by the luminescent body and the direct light component are reflectively guided separately.

13. The luminaire as claimed in claim 1, wherein the light source is a semiconductor laser light source.

14. The luminaire as claimed in claim 1, wherein the direct light component emitted from the luminaire corresponds to at most a laser class 1.

15. The luminaire as claimed in claim 1, wherein a second reflector surface is arranged over the at least one first reflector surface.

* * * * *